(12) United States Patent
Kim et al.

(10) Patent No.: US 7,554,774 B2
(45) Date of Patent: Jun. 30, 2009

(54) MAGNETIC RESISTANCE DEVICE AND METHOD OF MANUFACTURING THE SAME

(75) Inventors: Tae-wan Kim, Yongin-si (KR); Kee-won Kim, Chungcheongnam-do (KR); Soon-ju Kwon, Pohang-si (KR); Sang-jin Park, Pyeongtaek-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 463 days.

(21) Appl. No.: 11/045,106

(22) Filed: Jan. 31, 2005

(65) Prior Publication Data

US 2005/0168882 A1 Aug. 4, 2005

(30) Foreign Application Priority Data

Jan. 31, 2004 (KR) .............. 10-2004-0006464

(51) Int. Cl.
*G11B 5/39* (2006.01)
(52) U.S. Cl. .................................... 360/324.1
(58) Field of Classification Search ............. 360/324.1, 360/324, 324.2, 324.12; 428/141, 678, 811, 428/332; 365/113; 338/32 R; 257/422
See application file for complete search history.

(56) References Cited

U.S. PATENT DOCUMENTS

| | | | |
|---|---|---|---|
| 4,803,660 A * | 2/1989 | Kobayashi et al. | 365/113 |
| 5,793,279 A * | 8/1998 | Nepela | 338/32 R |
| 5,942,309 A * | 8/1999 | Kamijo | 428/141 |
| 6,329,078 B1 * | 12/2001 | Tsuge | 428/678 |
| 6,436,526 B1 * | 8/2002 | Odagawa et al. | 428/332 |
| 6,771,473 B2 * | 8/2004 | Hiramoto et al. | 360/324.2 |
| 6,828,897 B1 * | 12/2004 | Nepela | 338/32 R |
| 6,917,088 B2 * | 7/2005 | Takahashi et al. | 257/422 |
| 7,023,670 B2 * | 4/2006 | Saito | 360/324.12 |
| 7,336,451 B2 * | 2/2008 | Saito | 360/324.1 |
| 2002/0159203 A1 * | 10/2002 | Saito et al. | 360/324.2 |
| 2003/0137785 A1 | 7/2003 | Saito | |
| 2003/0179511 A1 * | 9/2003 | Xiao et al. | 360/324.2 |
| 2003/0193762 A1 * | 10/2003 | Hayashi et al. | 360/324.12 |
| 2004/0114283 A1 * | 6/2004 | Felser | 360/324 |
| 2005/0078417 A1 * | 4/2005 | Kishi et al. | 360/324.2 |
| 2005/0099738 A1 * | 5/2005 | Xue et al. | 360/324.1 |
| 2006/0044703 A1 * | 3/2006 | Inomata et al. | 360/324.1 |
| 2006/0183002 A1 * | 8/2006 | Yang et al. | 428/811 |

FOREIGN PATENT DOCUMENTS

JP 2003-218428 7/2003

OTHER PUBLICATIONS

Patent Abstracts of Japan, vol. 2003, No. 12, Dec. 5, 2003 & JP 2003 273420 (Sony Corp.) Sep. 26, 2003.
Johnson, P.R., et al., "Observation of Giant Magnetoresistance in a Heusler Alloy Spin Valve", IEEE Transaction on Magnetics, vol. 32, No. 5, pp. 4615-4617, (Sep. 1996).

* cited by examiner

*Primary Examiner*—Tianjie Chen
(74) *Attorney, Agent, or Firm*—Harness, Dickey & Pierce, P.L.C.

(57) ABSTRACT

In a magnetic resistance device, and a method of manufacturing the same, the magnetic resistance device includes a pinning layer, a pinned layer, a nonmagnetic layer, and a free layer stacked on one another, at least one of the pinned layer and the free layer being formed of an intermetallic compound.

18 Claims, 5 Drawing Sheets

● :A, ▲ :B, ○ :C, △ :D

MAGNETIC RESISTANCE DEVICE AND METHOD OF MANUFACTURING THE SAME

BACKGROUND OF THE INVENTION

1. Field of the Invention

The present invention relates to a magnetic resistance device and a method of manufacturing the same. More particularly, the present invention relates to a magnetic resistance device, and a method of manufacturing the same, having a free layer or a pinned layer including an intermetallic compound or an intermetallic alloy.

2. Description of the Related Art

Due to the rapid development of super thin film deposition in a high-vacuum state, it is now possible to grow and manufacture a magnetic thin film having a thickness of only a few nanometers, which is on the order of a range of spin-spin interaction. Accordingly, many phenomena that are not observed in bulk magnetic materials have been observed, and are on the verge of being utilized, in various technology, e.g., electrical household appliances and industrial parts, such as magnetic recording heads for recording information on a super high-density information storage medium or a magnetic random access memory (MRAM).

In a magnetic resistance device, electrical resistance varies according to magnetic energy. In the case of a magnetic resistance head, which detects information recorded on an information storage medium, e.g., a hard disk drive (HDD), a giant magnetic resistance (GMR) head and a tunnel magnetic resistance (TMR) head are widely used.

A GMR structure is generally formed of a sequential stack of a ferromagnetic body, i.e., a pinned layer/a metallic nonmagnetic body, i.e., a spacer layer/a ferromagnetic body, i.e., a free layer. This structure utilizes a principle that when an electron passes through the ferromagnetic layers, a resistance value varies according to a spin arrangement of the two magnetic layers. This phenomenon can be explained by spin-dependent scattering.

A TMR structure is generally formed of a sequential stack of a ferromagnetic body/an insulating layer, i.e., a tunnel barrier layer/a ferromagnetic body. In this structure, the insulating layer is interposed between two ferromagnetic bodies so that a tunneling current varies according to the relative magnetic directions of the ferromagnetic bodies. In the case of an MRAM using the GMR phenomenon, a voltage difference is not great because the variation in resistance according to magnetic direction is relatively small.

FIG. 1 illustrates a cross-sectional view of a conventional TMR device 10. In the conventional TMR device 10, an anti-ferromagnetic layer 12 that fixes electron spin of a first ferromagnetic layer 13 is formed on a substrate 11. The first ferromagnetic layer 13, which is a pinned layer, a tunnel barrier layer 14, and a second ferromagnetic layer 15, which is a free layer, are sequentially formed on the anti-ferromagnetic layer 12. The conventional TMR device 10 uses a principle that a tunneling current varies according to the relative magnetic direction of the ferromagnetic layers 13, 15. Here, the anti-ferromagnetic layer 12 (pinning layer) that fixes the spin direction of the first ferromagnetic layer 13 (pinned layer) is formed of an anti-ferromagnetic material.

If a current is applied when the magnetic spin direction of the first ferromagnetic layer 13 (pinned layer) is opposite to the magnetic spin direction of the second ferromagnetic layer 15 (free layer), only a small amount of current flows through a barrier layer due to the high magnetic resistance of the TMR device. Conversely, when the magnetic spin direction of the first ferromagnetic layer 13 (pinned layer) is the same as that of the second ferromagnetic layer 15 (free layer), a larger current flows because the magnetic resistance is low. A magnetoresistive (MR) ratio may be expressed by Formula 1:

$$MRratio = \frac{highMR - lowMR}{lowMR} = \frac{2P_1 P_2}{1 - P_1 P_2}, \quad (1)$$

where $P_1$ represents a spin polarization of the pinned layer 13 and $P_2$ represents a spin polarization of the free layer 15. When the MR ratio is high, a high-performance magnetic resistance device can be realized because the spins of the pinned layer 13 and of the free layer 15 are clearly distinguished.

As described above, a high MR ratio is very important for improving performance of a magnetic resistance device. In conventional magnetic resistance devices, CoFe or NiFe is used as a magnetic material for ferromagnetic layers, i.e., the free layer and the pinned layer. However, in order to manufacture more highly integrated and higher performance devices, a magnetic resistance material having a higher MR ratio is required.

SUMMARY OF THE INVENTION

The present invention is therefore directed to a magnetic resistance device, and a method of manufacturing the same, which substantially overcome one or more of the problems due to the limitations and disadvantages of the related art.

It is a feature of an embodiment of the present invention to provide a magnetic resistance device having a high MR ratio, thereby increasing a sensitivity margin.

It is another feature of an embodiment of the present invention to provide a magnetic resistance device using a novel magnetic resistance material.

It is still another feature of an embodiment of the present invention to provide a magnetic resistance device exhibiting improved performance and capable of being highly integrated.

It is yet another feature of an embodiment of the present invention to provide a method of manufacturing such a magnetic resistance device.

At least one of the above and other features and advantages of the present invention may be realized by providing a magnetic resistance device including a pinning layer, a pinned layer, a nonmagnetic layer, and a free layer stacked on one another, at least one of the pinned layer and the free layer being formed of an intermetallic compound.

The pinned layer, the nonmagnetic layer, and the free layer may be sequentially stacked on the pinning layer. The nonmagnetic layer may be a tunnel barrier layer. Alternatively, the nonmagnetic layer, the pinned layer, and the pinning layer may be sequentially stacked on the free layer. The non-magnetic layer may be a spacer layer.

At least one of the above and other features and advantages of the present invention may be realized by providing a method of manufacturing a magnetic resistance device including forming at least one of a pinned layer and a free layer of an intermetallic compound and stacking a pinning layer, the pinned layer, a nonmagnetic layer and the free layer on one another.

Forming the at least one of the pinned layer and the free layer of an intermetallic compound may include using co-sputtering.

Stacking the pinning layer, the pinned layer, the nonmagnetic layer and the free layer on one another may include sequentially stacking the pinned layer, the nonmagnetic layer, and the free layer on the pinning layer. Alternatively, stacking the pinning layer, the pinned layer, the nonmagnetic layer and the free layer on one another may include sequentially stacking the nonmagnetic layer, the pinned layer, and the pinning layer on the free layer.

Both the free layer and the pinned layer may be formed of an intermetallic compound.

The pinning layer may be formed of an intermetallic compound.

In any of the above embodiments, the intermetallic compound may have a general structural formula of $X_2YZ$, where X is a metal selected from the group consisting of the cobalt (Co) group and the copper (Cu) group, Y is selected from the group consisting of manganese (Mn), vanadium (V), titanium (Ti), nickel (Ni), and hafnium (Hf), and Z is, as a material of Group 3A, Group 4A or Group 5A, an anti-ferromagnetic material selected from the group consisting of aluminum (Al), silicon (Si), gallium (Ga), germanium (Ge), tin (Sn), and antimony (Sb).

In any of the above embodiments, the intermetallic compound may include at least one selected from the group consisting of PtMnSb, NiMnSb, CuMnSb, PdMnSb, PtFeSb, PtCrSb, and RhMnSb.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
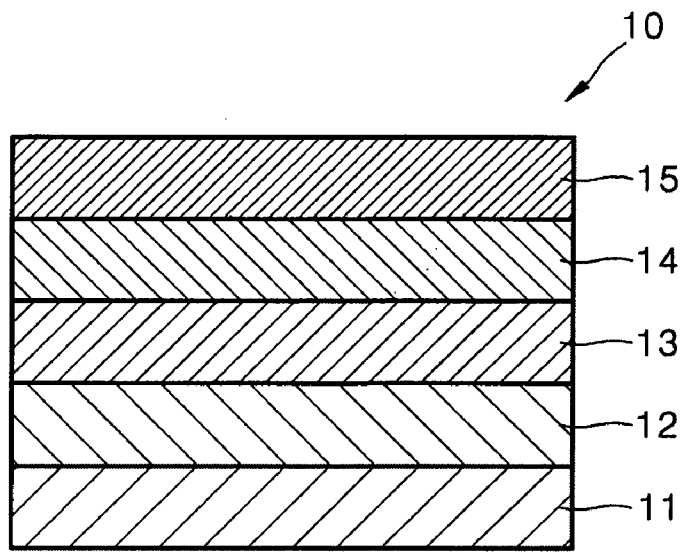
FIG. 1 illustrates a cross-sectional view of a conventional magnetic resistance device.

Korean Patent Application No. 10-2004-0006464, filed on Jan. 31, 2004, in the Korean Intellectual Property Office, and entitled: "Magnetic Resistance Device," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2A:
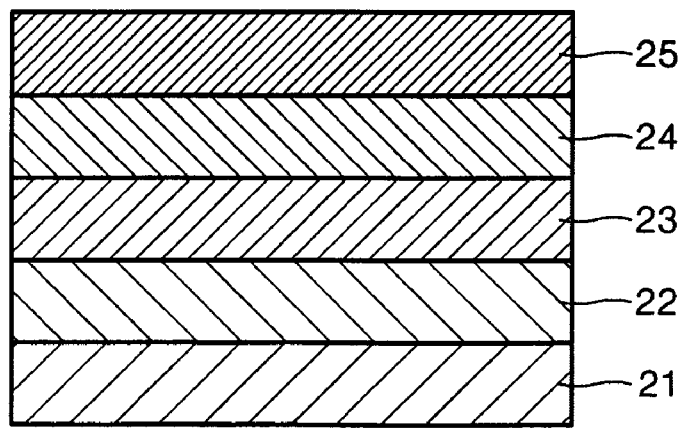
FIGS. 2A and 2B illustrate cross-sectional views of magnetic resistance devices according to a first embodiment and a second embodiment of the present invention, respectively.

FIG. 2A illustrates a cross-sectional view of a magnetic resistance device according to a first embodiment of the present invention.

Referring to FIG. 2A, a pinning layer 22, a pinned layer 23, a tunnel barrier layer 24, and a free layer 25 are sequentially formed on a substrate 21, e.g., a silicon wafer. While the magnetic resistance device may have a similar basic structure as a conventional tunneling magnetic resistance device, in the present invention, one or both of the pinned layer 23 and free layer 25 are formed of an intermetallic compound. If the pinned layer 23 is not formed of an intermetallic compound, it may be formed of a conventional ferromagnetic material or a conventional anti-ferromagnetic material, such as an IrMn alloy, a FeMn alloy, and a NiMn alloy.

Figure 2B:
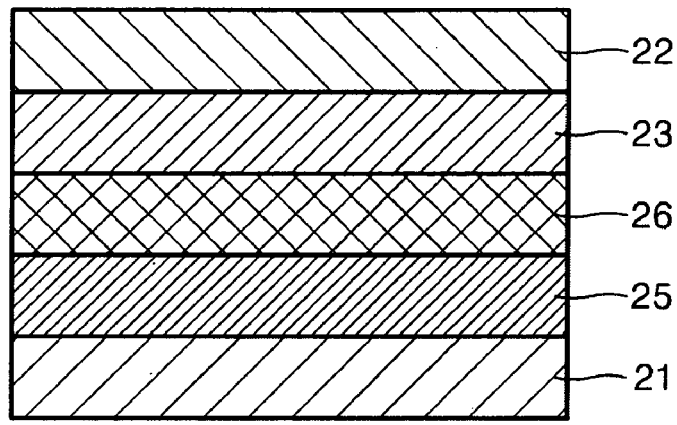

FIG. 2B illustrates a cross-sectional view of a magnetic resistance device according to a second embodiment of the present invention.

Referring to FIG. 2B, the free layer 25, a spacer layer 26, the pinned layer 23, and the pinning layer 22 are sequentially formed on the substrate 21, e.g., a silicon wafer. This structure is the basic structure of a spin valve type GMR device. Conventionally, the free layer 25 and the pinned layer 23 are formed of a CoFe alloy, which is a ferromagnetic material. However, it is an aspect of the present invention that one or both of the free layer 25 and the pinned layer 23 is formed of an intermetallic compound. The spacer layer 26 may be formed of an anti-ferromagnetic material, e.g., copper, as in the conventional art. In a conventional magnetic resistance device, the pinning layer 22 is usually formed of an alloy including Mn, such as an IrMn alloy, an FeMn alloy, or a NiMn alloy, i.e., an anti-ferromagnetic material. The pinning layer 22 fixes the magnetic direction of the pinned layer 23. However, in the present invention, the pinning layer 22 may also be formed of an intermetallic compound rather than a conventional anti-ferromagnetic material.

Operation of the magnetic resistance device having the above structure will now be described. More specifically, operation of a spin valve type magnetic resistance device will be described with reference to FIG. 2B.

When an external magnetic field is applied to the magnetic resistance device, the magnetization direction of the free layer 25 varies with respect to the magnetic direction of the pinned layer 23. As a result, the magnetic resistance between the pinned layer 23 and the free layer 25 changes. Through such resistance variation, information magnetically recorded in an information storage device, such as an MRAM or a magnetic recording medium, such as a HDD, is detected. Then, information recorded on the magnetic recording medium can be read by detecting the variation in the magnetic resistance between the free layer 25 and the pinned layer 23. At this time, an MR ratio, i.e., an amount of magnetic resistance variation to minimum device resistance, and an exchange binding force ($H_{ex}$: a force that fixes the magnetization direction of the pinned layer by the anti-ferromagnetic layer) must remain stable.

As described above, in the present invention, the pinned layer 23 or the free layer 25 may be formed of an intermetallic compound or an intermetallic alloy. Further, the pinning layer 22 may be formed of an intermetallic compound.

The intermetallic compound or alloy will now be described in greater detail. A general structural formula of the intermetallic compound or alloy is $X_2YZ$, where X is a metal of the cobalt (Co) or the copper (Cu) group; Y is manganese (Mn), vanadium (V), titanium (Ti), nickel (Ni), or hafnium (I-If); and Z is an anti-ferromagnetic material of Group 3A, 4A, or 5A, such as aluminum (Al), silicon (Si), gallium (Ga), germanium (Ge), tin (Sn), and antimony (Sb). Examples of the intermetallic compound include $Co_2MnSi$, $Cu_2MnAl$, $Cu_2MnSn$, and $Co_2TiSn$.

Figure 3:
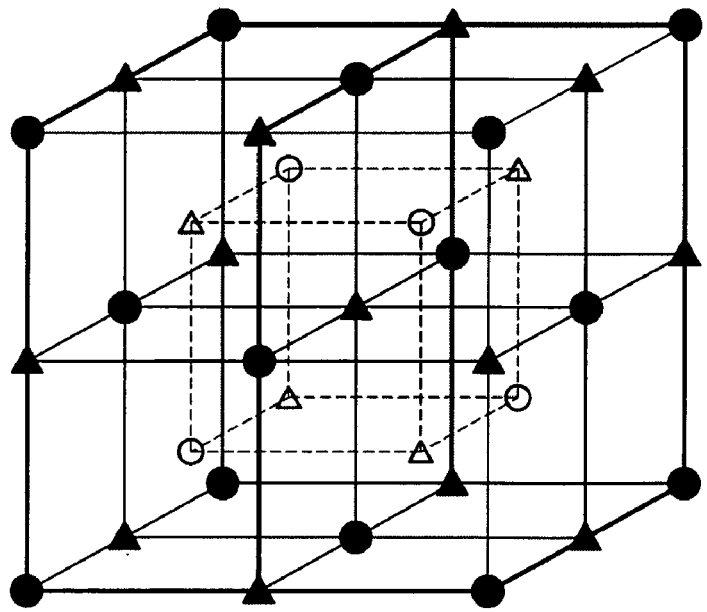
FIG. 3 is schematic drawing illustrating a crystal structure of an intermetallic compound.

FIG. 3 is a schematic drawing of a crystal having the structural formula $X_2YZ$ of the intermetallic compound. By way of example, when $Co_2MnSi$ is the intermetallic compound, Co is located at sites A and B, Mn is located at site C, and Si is located at site D.

An alternative structural formula of the intermetallic compound is XYZ. Examples of intermetallic compounds having a structural formula XYZ include PtMnSb, NiMnSb, CuMnSb, PdMnSb, PtFeSb, PtCrSb, and RhMnSb.

A process of manufacturing a magnetic resistance device by depositing an intermetallic compound having the above structure may utilize a conventional process for depositing a ferromagnetic layer in the manufacture of a magnetic resistance device. However, this conventional process of manufacturing an intermetallic compound is not efficient because of low productivity of the process and difficulty in controlling composition. For example, when depositing an intermetallic compound layer on a substrate using a sputtering process, it is difficult to make the intermetallic compound into a single target because the intermetallic compound is fragile. Therefore, it is preferable to deposit the intermetallic compound using a co-sputtering process. A co-sputtering process enables deposition of an intermetallic compound layer having a desired composition on a substrate by controlling a deposition speed after mounting object materials making an individual target in a sputtering process.

Figure 4:
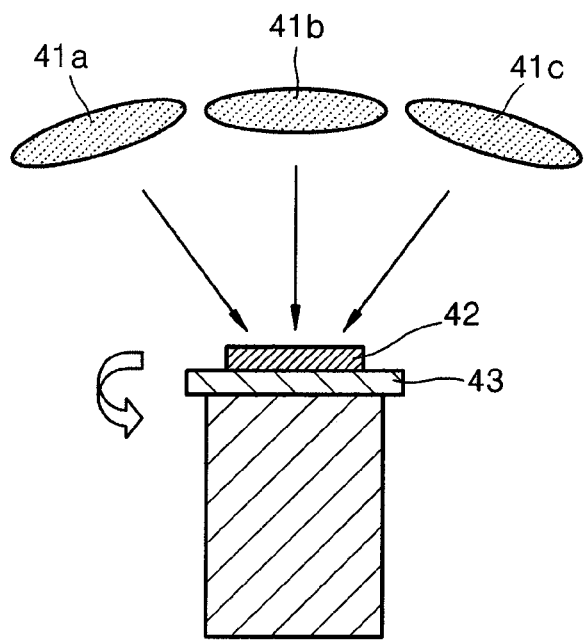
FIG. 4 illustrates a schematic of a method of forming an intermetallic compound in a magnetic resistance device according to an embodiment of the present invention.

FIG. 4 illustrates a schematic of deposition of an intermetallic compound on a substrate by co-sputtering. By way of example, when $Cu_2MnAl$ is the intermetallic compound, Cu, Mn, and Al are formed into a Cu target 41a, an Mn target 41b, and an Al target 41c, respectively. A substrate 42 mounted on a substrate holder 43 is sputtered using the formed targets positioned a predetermined distance from the substrate 42. Process conditions such as pressure, temperature, and deposition speed may be controlled to produce a thin film having desired characteristics. For manufacturing the magnetic resistance device according to an embodiment of the present invention, a process pressure was approximately $10^{-3}$ Torr and a temperature was about 200-400° C. Sputtering speeds of Cu, Mn, and Al were maintained at 83 Å/min, 44 Å/min, and 57 Å/min, respectively. Other insulating layers, e.g., a tunneling barrier layer, and spacer layers may be formed by conventional deposition methods. Generally, after forming an entire magnetic resistance device in-situ, a heat treatment process may be performed.

Figure 5A:
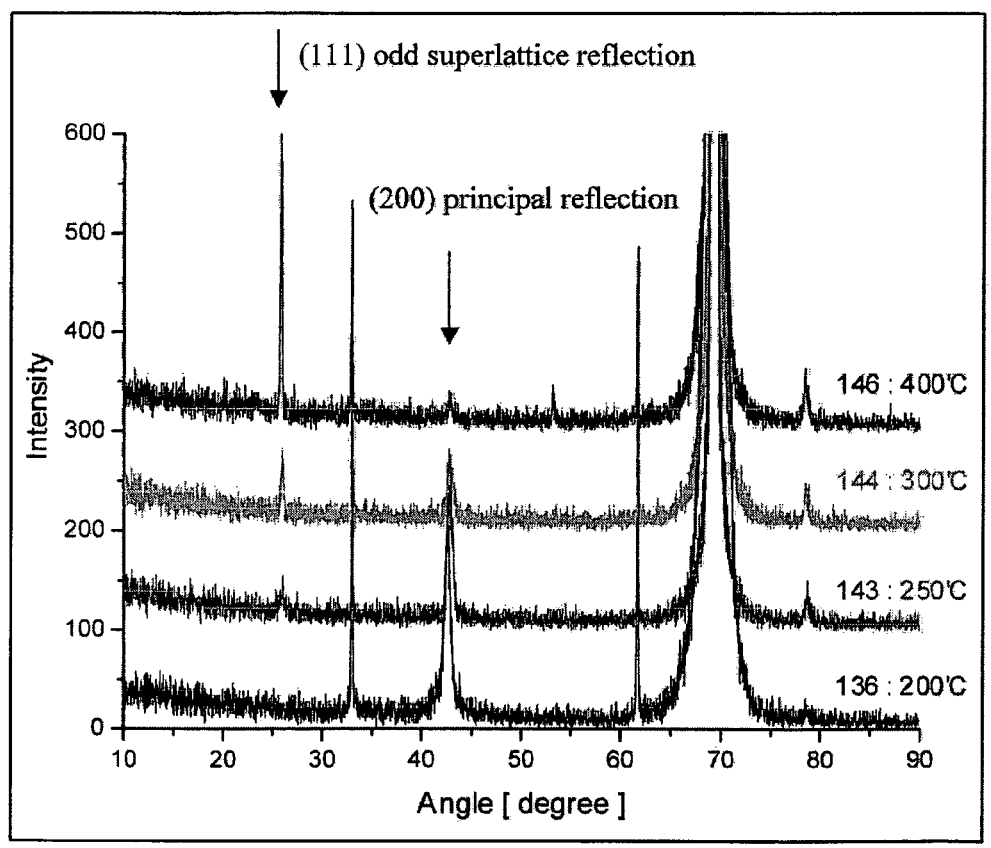
FIG. 5A is a graph of x-ray diffraction data of a magnetic resistance device according to the first embodiment of the present invention.

FIG. 5A is a graph of X-ray diffraction (XRD) data of a magnetic resistance device in which the free layer 25 is formed of an intermetallic compound according to the first embodiment of the present invention. For clarity, data obtained at temperatures of about 250° C., 300° C., and 400° C., is shifted by +100, +200, and +300 units, respectively, in the y-axis direction, to provide some space between sets of data.

Referring to FIG. 5A, peaks at angles of 33°, 62°, and 68° show the characteristics of the Si substrate. A peak at an angle of 25° is the peak of a direction of (111) superlattice, and a peak at angle of 42° indicates a disorder characteristic of each of the components in the crystal structure of a direction of (200) intermetallic compound. When a superlattice peak appears, the thin magnetic film is regarded as well formed. As the temperature of the substrate is increased, the superlattice peak at an angle of about 26° grows significantly and the disorder characteristic of the thin magnetic film at the angle of 42° decreases.

Figure 5B:
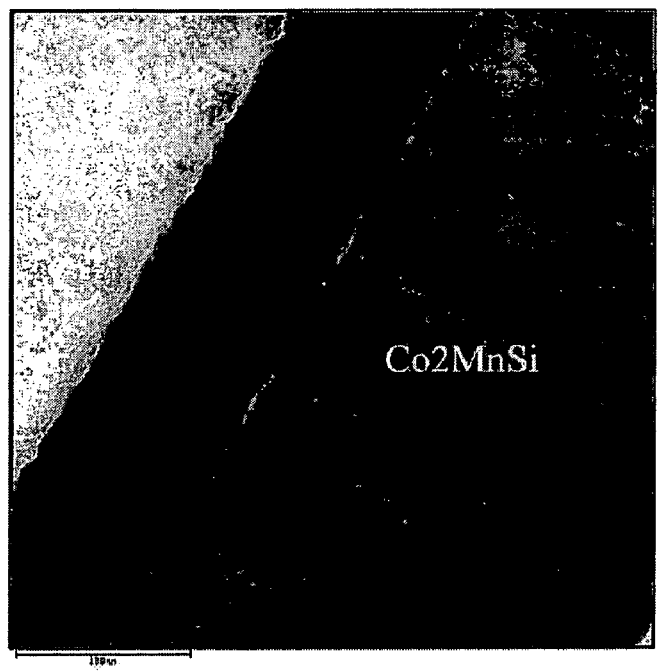
FIGS. 5B and 5C are transmission electron microscope (TEM) images of an intermetallic compound layer according to an embodiment of the present invention.
Figure 5C:
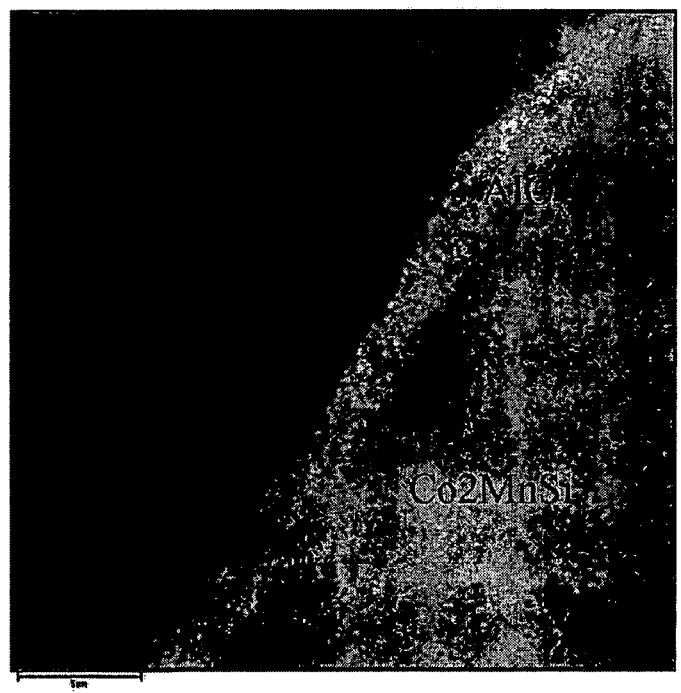

FIGS. 5B and 5C are transmission electron microscope (TEM) images of a cross-section of an interface between a ferromagnetic layer and an insulating layer of the magnetic resistance device according to an embodiment of the present invention. In the images, a boundary line between the $Co_2MnSi$ layer and the $AlO_x$ layer is clearly visible.

Figure 5D:
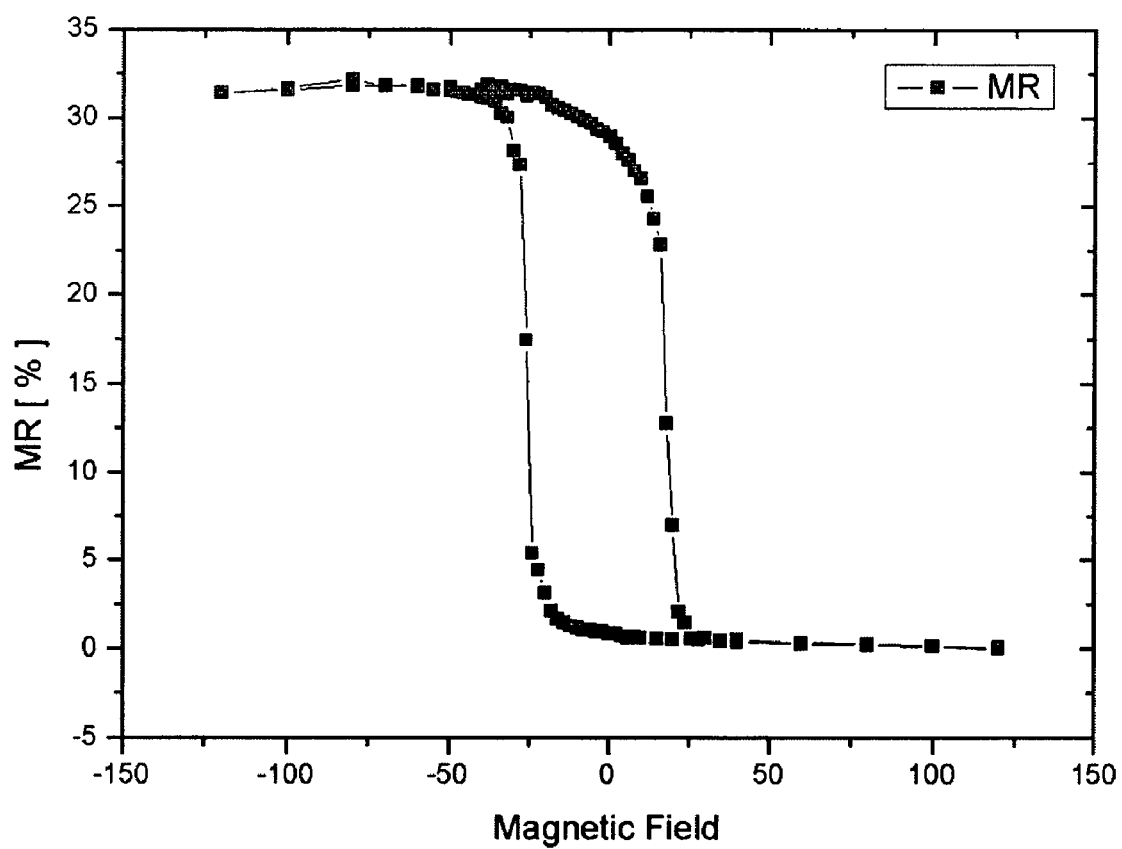
FIG. 5D is a graph of measured MR value versus magnetic field strength applied to the magnetic resistance device according to the first embodiment of the present invention.

FIG. 5D is a graph showing a magnetic characteristic of the magnetic resistance device manufactured according to an embodiment of the present invention measured using VSM equipment. As depicted in FIG. 5D, the MR ratio of the magnetic resistance device is greater than 30%.

The MR ratio is calculated using Formula 1. A ferromagnetic material generally used for a magnetic resistance device, such as NiFe, Co, or CoFe, has a polarization degree of about 40-50% (P=0.4-0.5). However, in the case of an intermetallic compound, the polarization degree is close to 100% (P=1.0). Therefore, when a free layer and a pinned layer are both formed of an intermetallic compound, theoretically, the MR ratio goes to infinity. When only one of the free layer and the pinned layer is formed of the intermetallic compound, $P_1=1$ and $P_2=0.5$, therefore, the MR ratio is about 200%. Although these theoretical figures are based on ideal conditions and differ considerably from empirically measured values, they show that if the free layer or the pinned layer is formed of a properly deposited intermetallic compound, a very large MR ratio can be obtained.

According to the present invention, by using an intermetallic compound, as opposed to a conventional material, for forming at least one of a free layer, a pinned layer, and a pinning layer, an improved MR ratio can be obtained. Accordingly, a sensitivity margin can be significantly improved. And, in the case of a magnetic resistance head, the high MR ratio may lead to development of higher density recording media.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a magnetic resistance device, comprising:
   stacking a pinning layer, a pinned layer, a nonmagnetic layer and a free layer on one another,
   wherein the pinning layer and at least one of the pinned layer and/or the free layer are formed of an intermetallic compound.

2. The method as claimed in claim 1, wherein forming the free layer of the intermetallic compound comprises using co-sputtering.

3. The method as claimed in claim 1, wherein stacking the pinning layer, the pinned layer, the nonmagnetic layer and the free layer on one another comprises sequentially stacking the pinned layer, the nonmagnetic layer, and the free layer on the pinning layer.

4. The magnetic resistance device as claimed in claim 1, wherein stacking the pinning layer, the pinned layer, the nonmagnetic layer and the free layer on one another comprises sequentially stacking the nonmagnetic layer, the pinned layer, and the pinning layer on the free layer.

5. The method as claimed in claim 1, wherein the intermetallic compound has the general structural formula of $X_2YZ$, where X is cobalt (Co) or copper (Cu), Y is manganese (Mn), vanadium (V), titanium (Ti), nickel (Ni), or hafnium (Hf), and Z is aluminum (Al), silicon (Si), gallium (Ga), germanium (Ge), tin (Sn), or antimony (Sb).

6. The method as claimed in claim 1, wherein the intermetallic compound has the general structural formula of XYZ, the intermetallic compound being CuMnSb, PdMnSb, or RhMnSb.

7. The method as claimed in claim 1, further comprising forming both the free layer and the pinned layer of an intermetallic compound.

8. The method as claimed in claim 7, wherein the intermetallic compound has the general structural formula of $X_2YZ$, where X is cobalt (Co) or copper (Cu), Y is manganese (Mn), vanadium (V), titanium (Ti), nickel (Ni), or hafnium (Hf), and Z is aluminum (Al), silicon (Si), gallium (Ga), germanium (Ge), tin (Sn), or antimony (Sb).

9. The method as claimed in claim 7, wherein the intermetallic compound has the general structural formula of XYZ, the intermetallic compound being CuMnSb, PdMnSb, or RhMnSb.

10. The magnetic resistance device as claimed in claim 7, wherein the pinning layer is formed of the intermetallic compound.

11. A magnetic resistance device, comprising:
a pinning layer;
a pinned layer;
a nonmagnetic layer; and
a free layer stacked on one another,
wherein the pinning layer and at least one of the pinned layer and/or the free layer are formed of an intermetallic compound.

12. The magnetic resistance device as claimed in claim 11, wherein the pinned layer, the nonmagnetic layer, and the free layer are sequentially stacked on the pinning layer, the free layer being an uppermost layer of the magnetic resistance device.

13. The magnetic resistance device as claimed in claim 12, wherein the nonmagnetic layer is a tunnel barrier layer.

14. The magnetic resistance device as claimed in claim 11, wherein the nonmagnetic layer, the pinned layer, and the pinning layer are sequentially stacked on the free layer, the free layer being directly between the nonmagnetic layer and a semiconductor substrate.

15. The magnetic resistance device as claimed in claim 14, wherein the non-magnetic layer is a spacer layer.

16. The magnetic resistance device as claimed in claim 11, wherein the intermetallic compound has a general structural formula of $X_2YZ$ or XYZ, and where X is a metal, Y is a transitional metal, and Z is an anti-ferromagnetic material of Group 3A, Group 4A, or Group 5A.

17. The magnetic resistance device as claimed in claim 16, wherein the intermetallic compound has the general structural formula of $X_2YZ$, where X includes cobalt (Co) or copper (Cu), and Y includes manganese (Mn), vanadium (V), titanium (Ti), nickel (Ni), or hafnium (Hf), and Z is aluminum (Al), silicon (Si), gallium (Ga), germanium (Ge), tin (Sn), or antimony (Sb).

18. The magnetic resistance device as claimed in claim 16, wherein the intermetallic compound has the general structural formula of XYZ, the intermetallic compound being PtMnSb, NiMnSb, CuMnSb, PdMnSb, PtFeSb, PtCrSb, or PhMnSb.

* * * * *